United States Patent
Koo et al.

(10) Patent No.: US 12,538,433 B2
(45) Date of Patent: Jan. 27, 2026

(54) STENCIL MASK AND STENCIL PRINTING METHOD

(71) Applicant: STATS ChipPAC Pte. Ltd., Singapore (SG)

(72) Inventors: KyoWang Koo, Incheon (KR); KiCheol Lee, Incheon (KR); BoLee Lim, Incheon (KR)

(*) Notice: Subject to any disclaimer, the term of this patent is extended or adjusted under 35 U.S.C. 154(b) by 399 days.

(21) Appl. No.: 18/299,072

(22) Filed: Apr. 12, 2023

(65) Prior Publication Data

US 2023/0337369 A1    Oct. 19, 2023

(30) Foreign Application Priority Data

Apr. 14, 2022  (CN) .......................... 202210400953.1

(51) Int. Cl.
| | |
|---|---|
| *H05K 3/12* | (2006.01) |
| *B23K 37/06* | (2006.01) |
| *H01L 23/00* | (2006.01) |
| *B23K 101/42* | (2006.01) |

(52) U.S. Cl.
CPC ........... *H05K 3/1225* (2013.01); *B23K 37/06* (2013.01); *H01L 24/83* (2013.01); *B23K 2101/42* (2018.08); *H01L 2224/83192* (2013.01); *H01L 2224/83815* (2013.01)

(58) Field of Classification Search
CPC .......... H05K 3/00; H05K 3/12; H05K 3/1225; H05K 3/34; H01L 21/00; H01L 21/60; H01L 24/83; H01L 2224/83192; H01L 2224/83815; B23K 37/06; B23K 2101/42
See application file for complete search history.

(56) References Cited

U.S. PATENT DOCUMENTS

| | | | | |
|---|---|---|---|---|
| 5,593,080 A | * | 1/1997 | Teshima ............... | H05K 3/3485 101/127 |
| 5,740,730 A | * | 4/1998 | Thompson, Sr. .... | H05K 3/1225 118/406 |
| 5,878,661 A | * | 3/1999 | Glovatsky ............ | H05K 3/1225 101/127 |
| 6,979,520 B2 | | 12/2005 | Noguchi | |
| | | (Continued) | | |

FOREIGN PATENT DOCUMENTS

| | | |
|---|---|---|
| CN | 106981428 A | 7/2017 |
| TW | 202013536 A | 4/2020 |
| WO | 2019176198 A1 | 9/2019 |

*Primary Examiner* — Nguyen Q. Ha
(74) *Attorney, Agent, or Firm* — Junhe Law Office, P.C.; Yi Zhang (57) ABSTRACT

A stencil mask and a stencil printing method are provided. The stencil mask includes: a non-reinforcement portion having a mask surface configured to contact a substrate surface of a substrate; and a reinforcement portion having a thickness greater than that of the non-reinforcement portion, wherein the reinforcement portion includes: an embossed surface for insertion into a cavity of the substrate and configured to contact a cavity bottom surface when the stencil mask is placed onto the substrate for stencil printing; and at least one first stencil window that allows the fluid material to flow through the reinforcement portion, wherein the at least one first stencil window is aligned with at least one printing region within the cavity when the stencil mask is placed onto the substrate for stencil printing.

15 Claims, 10 Drawing Sheets

(56) References Cited

U.S. PATENT DOCUMENTS

| | | | |
|---|---|---|---|
| 7,011,988 B2 * | 3/2006 | Forcier | G02B 6/43 |
| | | | 257/E23.092 |
| 8,087,566 B2 * | 1/2012 | Budd | H01L 24/11 |
| | | | 228/246 |
| 8,455,908 B2 * | 6/2013 | Welch | H01L 25/0753 |
| | | | 257/431 |
| 8,820,612 B2 * | 9/2014 | Feger | B23K 1/0016 |
| | | | 228/123.1 |
| 12,274,008 B2 * | 4/2025 | Li | H05K 3/34 |

* cited by examiner

STENCIL MASK AND STENCIL PRINTING METHOD

TECHNICAL FIELD

The present application generally relates to semiconductor devices, and more particularly, to a stencil mask and a stencil printing method.

BACKGROUND OF THE INVENTION

The semiconductor industry is constantly faced with complex integration challenges as consumers want their electronics to be smaller, faster and higher performance with more and more functionalities packed into a single device. One of the solutions is the cavity printed circuit board (PCB) technique, in which cavities are formed in a PCB, and then electrical components are disposed in the cavities to reduce the thickness of the total package. However, a stencil mask for printing solder paste into the cavities of the PCB is easy to bend, bringing down the yield of the electrical components mounted in the cavities of the PCB.

Therefore, a need exists for a more reliable stencil mask.

SUMMARY OF THE INVENTION

An objective of the present application is to provide a stencil mask with higher reliability.

According to an aspect of embodiments of the present application, a stencil mask for printing a fluid material onto a substrate is provided. The substrate includes a substrate surface, a cavity having a cavity bottom surface below the substrate surface, and at least one printing region within the cavity. The stencil mask includes: a non-reinforcement portion having a mask surface configured to contact the substrate surface of the substrate; and a reinforcement portion having a thickness greater than that of the non-reinforcement portion, wherein the reinforcement portion includes: an embossed surface for insertion into the cavity of the substrate and configured to contact the cavity bottom surface when the stencil mask is placed onto the substrate for stencil printing; and at least one first stencil window that allows the fluid material to flow through the reinforcement portion, wherein the at least one first stencil window is aligned with the at least one printing region within the cavity when the stencil mask is placed onto the substrate for stencil printing.

According to another aspect of embodiments of the present application, a stencil printing method is provided. The method includes: providing a substrate, wherein the substrate includes a substrate surface and a cavity having a cavity bottom surface below the substrate surface; providing a stencil mask, wherein the stencil mask includes a non-reinforcement portion and a reinforcement portion having a thickness greater than that of the non-reinforcement portion, and wherein the non-reinforcement portion has a mask surface, and the reinforcement portion has an embossed surface and at least one first stencil window; placing the stencil mask onto the substrate, such that the embossed surface is inserted into the cavity of the substrate and is in contact with the cavity bottom surface; depositing a fluid material on the stencil mask such that the fluid material can flow through the at least one first stencil window onto at least one printing region in the cavity bottom surface; and planarizing the fluid material using a squeegee.

It is to be understood that both the foregoing general description and the following detailed description are exemplary and explanatory only, and are not restrictive of the invention. Further, the accompanying drawings, which are incorporated in and constitute a part of this specification, illustrate embodiments of the invention and together with the description, serve to explain principles of the invention.

BRIEF DESCRIPTION OF DRAWINGS

The drawings referenced herein form a part of the specification. Features shown in the drawing illustrate only some embodiments of the application, and not of all embodiments of the application, unless the detailed description explicitly indicates otherwise, and readers of the specification should not make implications to the contrary.

The same reference numbers will be used throughout the drawings to refer to the same or like parts.

DETAILED DESCRIPTION OF THE INVENTION

The following detailed description of exemplary embodiments of the application refers to the accompanying drawings that form a part of the description. The drawings illustrate specific exemplary embodiments in which the application may be practiced. The detailed description, including the drawings, describes these embodiments in sufficient detail to enable those skilled in the art to practice the application. Those skilled in the art may further utilize other embodiments of the application, and make logical, mechanical, and other changes without departing from the spirit or scope of the application. Readers of the following detailed description should, therefore, not interpret the description in a limiting sense, and only the appended claims define the scope of the embodiment of the application.

In this application, the use of the singular includes the plural unless specifically stated otherwise. In this application, the use of "or" means "and/or" unless stated otherwise. Furthermore, the use of the term "including" as well as other forms such as "includes" and "included" is not limiting. In addition, terms such as "element" or "component" encompass both elements and components including one unit, and elements and components that include more than one sub-unit, unless specifically stated otherwise. Additionally, the section headings used herein are for organizational purposes only, and are not to be construed as limiting the subject matter described.

As used herein, spatially relative terms, such as "beneath", "below", "above", "over", "on", "upper", "lower", "left", "right", "vertical", "horizontal", "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Figure 1A:
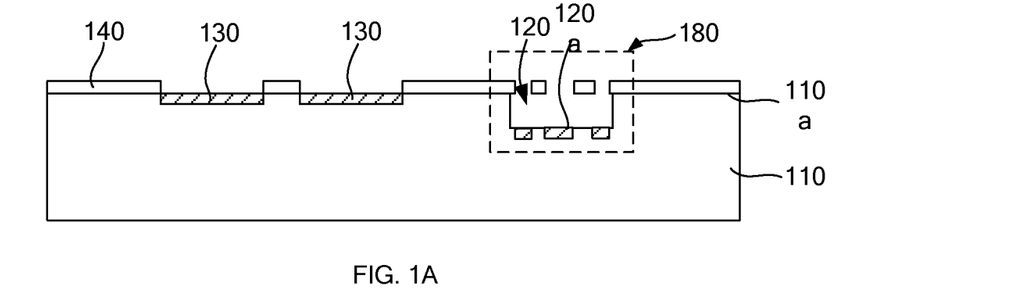
FIG. 1A is a cross-sectional view of a printed circuit board (PCB).
Figure 1B:
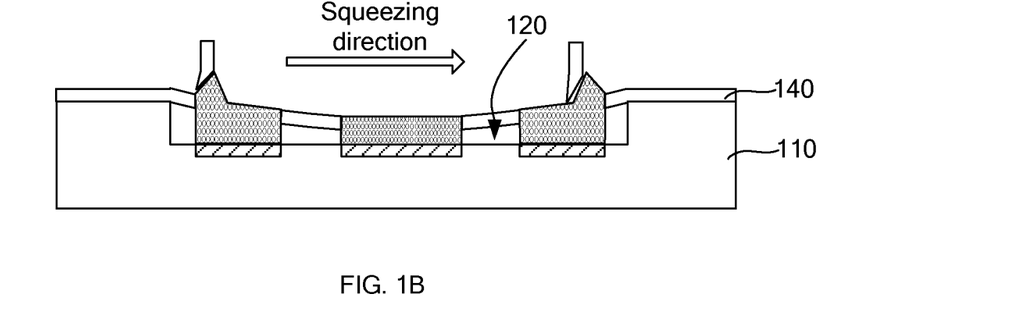
FIG. 1B is an enlarged view of a portion of the PCB shown in FIG. 1A.

FIG. 1A illustrates a cross-sectional view of a printed circuit board (PCB) 110, and FIG. 1B illustrates an enlarged view of a portion 180 of the PCB 110 shown in FIG. 1A.

Referring to FIG. 1A, a cavity 120 is formed in the PCB 110, and a plurality of contact pads 130 are formed in the PCB 110 and are exposed from a top surface 110a of the PCB 110 and the cavity 120. Solder paste may be printed on the contact pads 130 by using a stencil mask 140, and then electrical components can be mounted onto the contact pads 130 via the solder paste. In the example shown in FIG. 1A, the stencil mask 140 is placed onto the top surface 110a of the PCB 110, and the contact pads 130 are exposed from windows on the stencil mask 140. Then, solder paste is printed on the stencil mask 140, and a squeegee is used to press the solder paste through the windows on the stencil mask 140 and onto the contact pads 130. However, as shown in FIG. 1B, a portion of the stencil mask 140 aligned with the cavity 120 may bend when the squeegee presses the stencil mask 140, which may cause heights or volumes of the solder paste patterns in the cavity to be different. For example, a solder paste pattern formed in the center of the cavity 120 may have a smaller height than other solder paste patterns at the peripheral area of cavity 120. The non-uniform solder paste patterns may affect the subsequent mounting process of the electrical components, and reduce the reliability of a semiconductor package formed with such process.

To address at least one of the above problems, in the embodiments of the present application, a stencil mask including a non-reinforcement portion and a reinforcement portion is provided. The reinforcement portion has a thickness greater than that of the non-reinforcement portion. When the stencil mask is placed onto a cavity PCB and used to print a fluid material onto the cavity PCB, the non-reinforcement portion can be in contact with a top surface of the PCB, and the reinforcement portion can be in contact with a bottom surface of a cavity in the PCB. The stencil windows in the reinforcement portion may be aligned with printing regions in the cavity of the PCB, and a fluid material can flow through the stencil windows onto the printing regions. As the reinforcement portion of the stencil mask contacts with the bottom surface of the cavity in the PCB, the stencil mask can bear a significant force applied by a squeegee and may not bend. Thus, the heights of the fluid material patterns formed in the cavity are substantially the same as each other, which improves the reliability of a semiconductor package formed with such process.

Figure 2A:
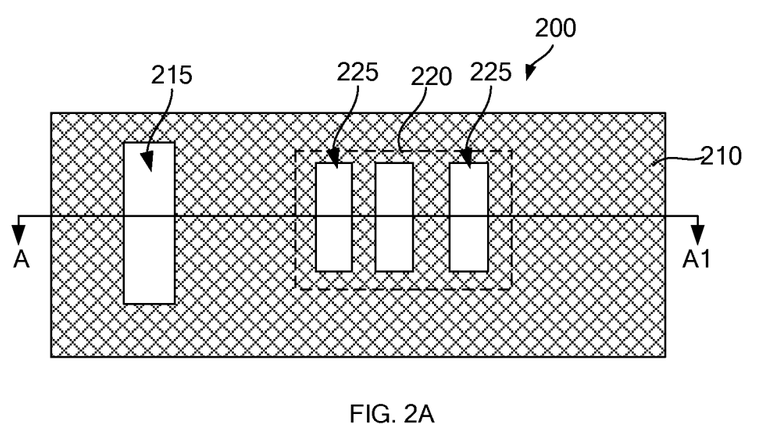
FIG. 2A is a top view of a stencil mask according to an embodiment of the present application.
Figure 2B:
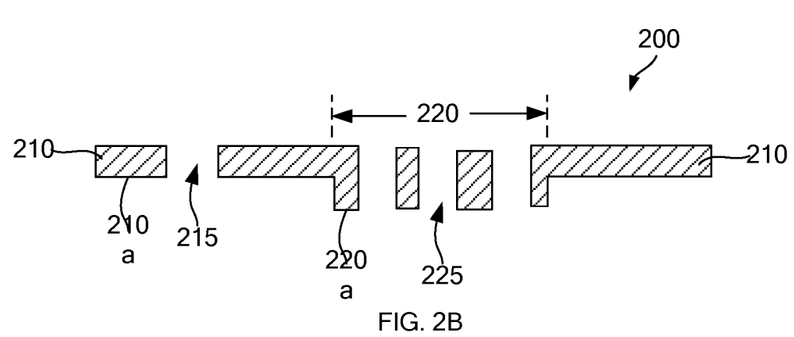
FIG. 2B is a cross-sectional view along a section line of the stencil mask shown in FIG. 2A.

FIG. 2A illustrates a top view of a stencil mask 200 according to an embodiment of the present application, and FIG. 2B is a cross-sectional view along a section line A-A1 of the stencil mask 200 shown in FIG. 2A. The stencil mask 200 can be used for printing a fluid material onto a substrate having a cavity (for example, printing solder paste onto the cavity PCB 110 shown in FIG. 1A).

As shown in FIGS. 2A and 2B, the stencil mask 200 includes a non-reinforcement portion 210 and a reinforcement portion 220. The non-reinforcement portion 210 has a mask surface 210a, which can contact a substrate surface of the substrate when the stencil mask 200 is used to print a fluid material onto the substrate. For example, when the stencil mask 200 is used to print solder paste onto the cavity PCB 110 shown in FIG. 1A, the mask surface 210a is configured to contact the top surface 110a of the cavity PCB 110 as shown in FIG. 1A.

The reinforcement portion 220 has a thickness greater than that of the non-reinforcement portion 210. As shown in FIG. 2B, the reinforcement portion 220 includes an embossed surface 220a for insertion into the cavity of the substrate. In some examples, the thickness of the reinforcement portion 220 is greater than that of the non-reinforcement portion 210 by a depth of the cavity of the substrate, such that when the stencil mask 200 is placed onto the substrate for stencil printing, the embossed surface 220a can contact a cavity bottom surface of the substrate to provide support for the stencil mask 200. The reinforcement portion 220 further includes at least one first stencil window 225. When the stencil mask 200 is placed onto the substrate for stencil printing, the at least one first stencil window 225 is aligned with at least one printing region in the cavity of the substrate, such that each first stencil window 225 may allow the fluid material to flow through the reinforcement portion 220 onto a respective printing region in the cavity of the substrate. For example, when the stencil mask 200 is placed onto the cavity PCB 110 shown in FIG. 1A for stencil printing, the embossed surface 220a may contact the cavity bottom surface 120a of the cavity PCB 110. The three first stencil windows 225 are then aligned with the three contact pads in the cavity 120, thereby the solder paste can be deposited on the three contact pads in the cavity 120.

In some embodiments, as shown in FIGS. 2A and 2B, the non-reinforcement portion 210 of the stencil mask 200 may include at least one second stencil window 215. When the stencil mask 200 is placed onto the substrate for stencil printing, the at least one second stencil window 215 is aligned with at least one printing region on the substrate surface of the substrate, such that each second stencil window 215 may allow the fluid material to flow through the non-reinforcement portion 210 and onto a respective printing region on the substrate surface of the substrate.

In some embodiments, the layout of the first stencil windows 225 and the second stencil windows 215 may be designed according to positions or shapes of respective printing regions on the substrate surface and in the cavity of the substrate. For example, each of the at least one first stencil window 225 and the at least one second stencil window 215 may have at its bottom a cross-sectional shape which is substantially the same as a shape of a corresponding printing region, thereby allowing the solder paste to fully cover the printing region. In some other examples, the cross-sectional shapes of the bottoms of the first stencil windows 225 or the second stencil windows 215 may be slightly smaller than a shape of its corresponding printing region, resulting in a bleed-resistant seal between the printing region and the stencil mask.

As the windows in the stencil mask 200 may be filled with the fluid material which should be completely removed from the stencil mask 200 after the printing process, sidewalls of the stencil windows can be smooth as possible. In an embodiment, each of the first stencil windows 225 and the second stencil windows 215 may have a vertically straight sidewall or an inclined wall. For example, each of the first stencil windows 225 and the second stencil windows 215 may have a truncated shape with a trapezoidal cross section. In another embodiment, a coating layer with anti-stick properties, for example, a solder paste repellent coating may be formed on the sidewalls of the first stencil windows 225 and the second stencil windows 215, so as to prevent adhesion of the solder paste to the stencil mask 200.

The non-reinforcement portion 210 and the reinforcement portion 220 of the stencil mask 200 shown in FIGS. 2A and 2B may be implemented in various structures, but aspects of the present application are not limited thereto. Further, the stencil mask 200 can be used for printing any other desired fluid material (for example, glue, ink, solder mask, etc.) onto any other types of substrate such as a glass plate, a steel plate, a semiconductor substrate, etc.

Figure 3:
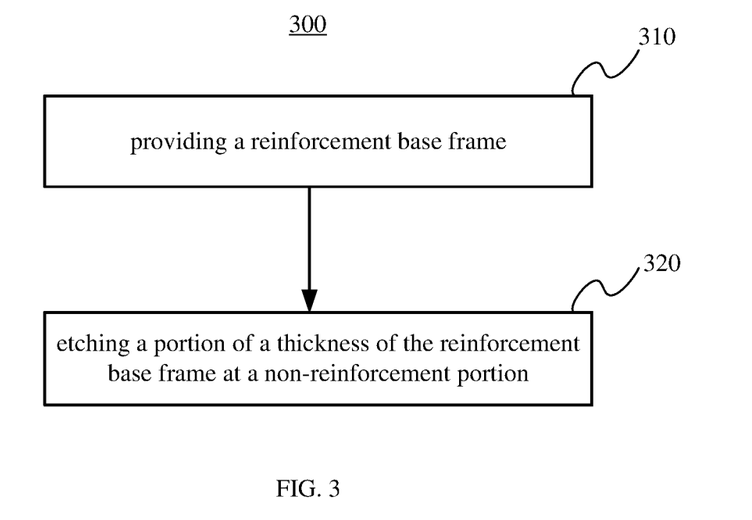
FIG. 3 is a flowchart illustrating a method for forming a stencil mask according to an embodiment of the present application.

Referring to FIG. 3, a method 300 for forming a stencil mask is illustrated according to an embodiment of the present application. For example, the method 300 may be used to form the stencil mask 200 shown in FIGS. 2A and 2B.

As illustrated in FIG. 3, the method 300 may start with providing a reinforcement base frame in block 310. In some embodiments, the reinforcement base frame may be a raw stencil mask with a uniform height formed using a conventional method. Afterwards, in block 320, a portion of the reinforcement base frame is etched to form a non-reinforcement portion of the stencil mask, while the remaining portion of the reinforcement base frame forms a reinforcement portion of the stencil mask.

Figure 4A:
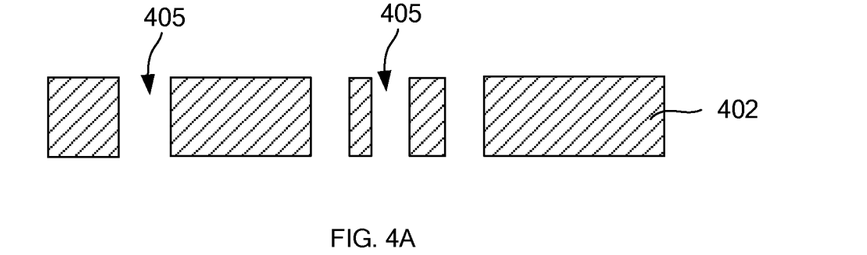
FIGS. 4A and 4B are cross-sectional views illustrating various steps of the method for forming a stencil mask illustrated in FIG. 3 according to an embodiment of the present application.
Figure 4B:
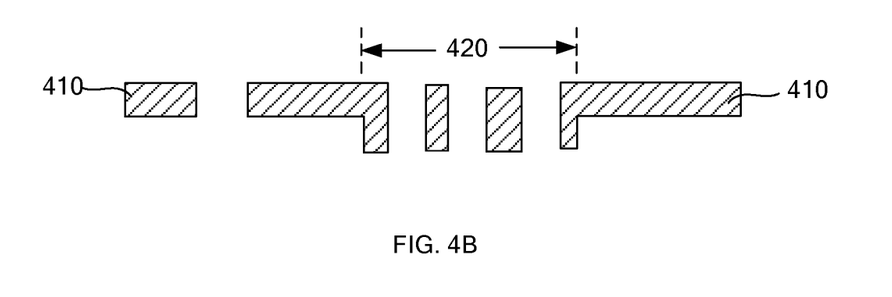

Referring to FIGS. 4A and 4B, cross-sectional views illustrating various blocks of the method 300 for forming a stencil mask are illustrated. In the following, the method 300 of FIG. 3 will be described with references to FIGS. 4A and 4B in more details.

As illustrated in FIG. 4A, a reinforcement base frame 402 is provided. The reinforcement base frame 402 may be a raw stencil mask with a uniform height formed by a conventional method. For example, the reinforcement base frame 402 may be made of stainless steel, nickel, brass or other suitable material(s). The reinforcement base frame 402 may include at least one window 405. For example, the at least one window 405 may be formed by an etching process or a laser cutting process.

Afterwards, as illustrated in FIG. 4B, a portion of the reinforcement base frame 402 in the peripheral area is etched to form a non-reinforcement portion 410 of the stencil mask, and the remaining portion of the reinforcement base frame 402 in the central area which are not etched forms a reinforcement portion 420 of the stencil mask. It can be seen that the height of the stencil mask is not etched in full at the non-reinforcement portion 410.

In some embodiments, a chemical etching or dry etching process may be employed to etch the reinforcement base frame 402. In an example, a patterned resist may be formed on the bottom surface of the reinforcement base frame 402 to define a portion of the reinforcement base frame 402 to be etched. Then, an etching process is carried out from the bottom surface of the reinforcement base frame 402 to remove a portion of the thickness of the reinforcement base frame 402 exposed from the patterned resist. A depth that is etched can be controlled by adjusting various parameters of the etching process.

In some embodiments, a laser cutting process may be employed to etch a portion of the thickness of the reinforcement base frame 402 to form the non-reinforcement portion 410. The laser cutting process can be controlled by Computer-Aided Design (CAD) data, and therefore the size and depth of the etched portion can be accurate.

Figure 5:
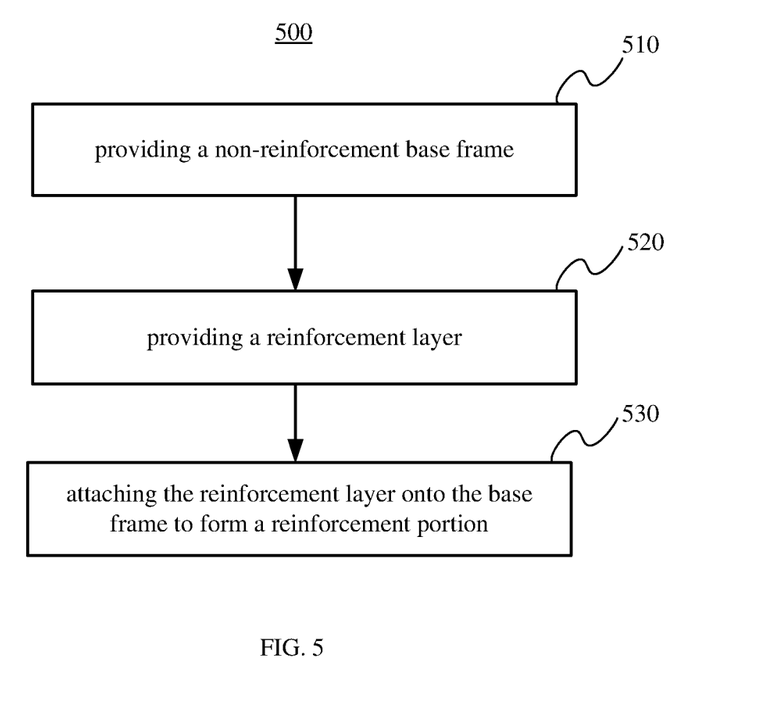
FIG. 5 is a flowchart illustrating a method for forming a stencil mask according to another embodiment of the present application.

Referring to FIG. 5, a flowchart illustrating a method 500 for forming a stencil mask is illustrated according to another embodiment of the present application. For example, the method 500 may also be used to form the stencil mask 200 shown in FIGS. 2A and 2B.

As illustrated in FIG. 5, the method 500 may start with providing a non-reinforcement base frame in block 510. In some embodiments, the non-reinforcement base frame may be a raw stencil mask with a uniform height formed by a conventional method. Afterwards, a reinforcement layer is provided in block 520, and the reinforcement layer is attached onto a portion of the non-reinforcement base frame to form a reinforcement portion of the stencil mask in block 530.

Figure 6A:
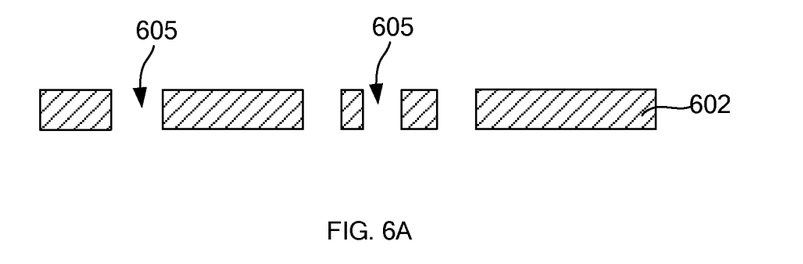
FIGS. 6A to 6C are cross-sectional views illustrating various steps of the method for forming a stencil mask illustrated in FIG. 5 according to an embodiment of the present application.

As illustrated in FIG. 6A, a non-reinforcement base 602 is provided. The non-reinforcement base frame 602 may be a raw stencil mask with a uniform height formed by a conventional method. For example, the non-reinforcement base frame 602 may be made of the same material as the reinforcement base frame 402 shown in FIG. 4A. In some embodiments, the non-reinforcement base frame 602 shown in FIG. 6A may have a thickness smaller than that of the reinforcement base frame 402 shown in FIG. 4A. The non-reinforcement base frame 602 may include at least one window 605 formed by an etching process or a laser cutting process.

Figure 6B:
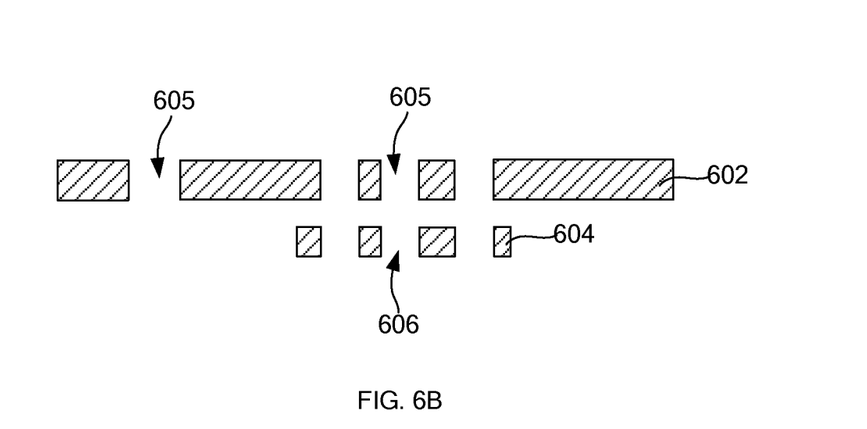

Then, as illustrated in FIG. 6B, a reinforcement layer 604 is provided. The reinforcement layer 604 may be made of the same material(s) as the non-reinforcement base frame 602, or may be made of a different material. In the example shown in FIG. 6B, the reinforcement layer 604 is used to reinforce a central area of the non-reinforcement base frame 602, and thus it has at least one window 606 corresponding to the respective windows(s) 605 in the central area of the non-reinforcement base frame 602.

Figure 6C:
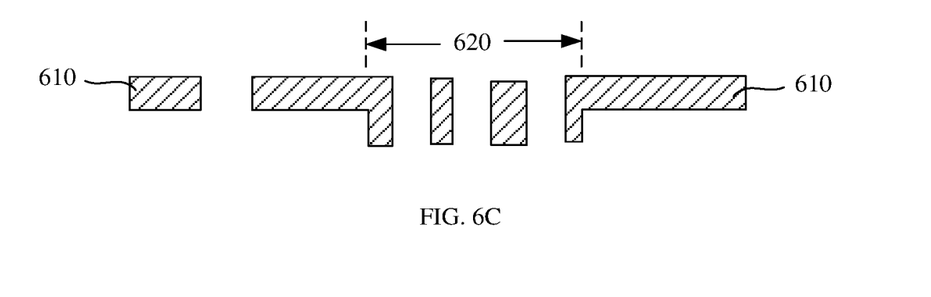

Afterwards, as illustrated in FIG. 6B and FIG. 6C, the reinforcement layer 604 is attached onto the central area of the non-reinforcement base frame 602, and the windows 606 in the reinforcement layer 604 are aligned with the windows 605 in the central area of the non-reinforcement base frame 602, respectively. In the example shown in FIG. 6C, the central area of the non-reinforcement base frame 602 and the reinforcement layer 604 together form a reinforcement portion 620 of the stencil mask, and the peripheral area of the non-reinforcement base frame 602 which is not attached with the reinforcement layer 604 forms a non-reinforcement portion 610 of the stencil mask. In some embodiments, the reinforcement layer 604 can be attached onto the non-reinforcement base frame 602 using adhesive, solder or other suitable material(s) or techniques.

The aforementioned stencil masks can be used in a stencil printing method in a manner similar to the conventional stencil masks, as elaborated below. However, the durability of the stencil masks according to the embodiments of the present application is improved significantly.

Figure 7:
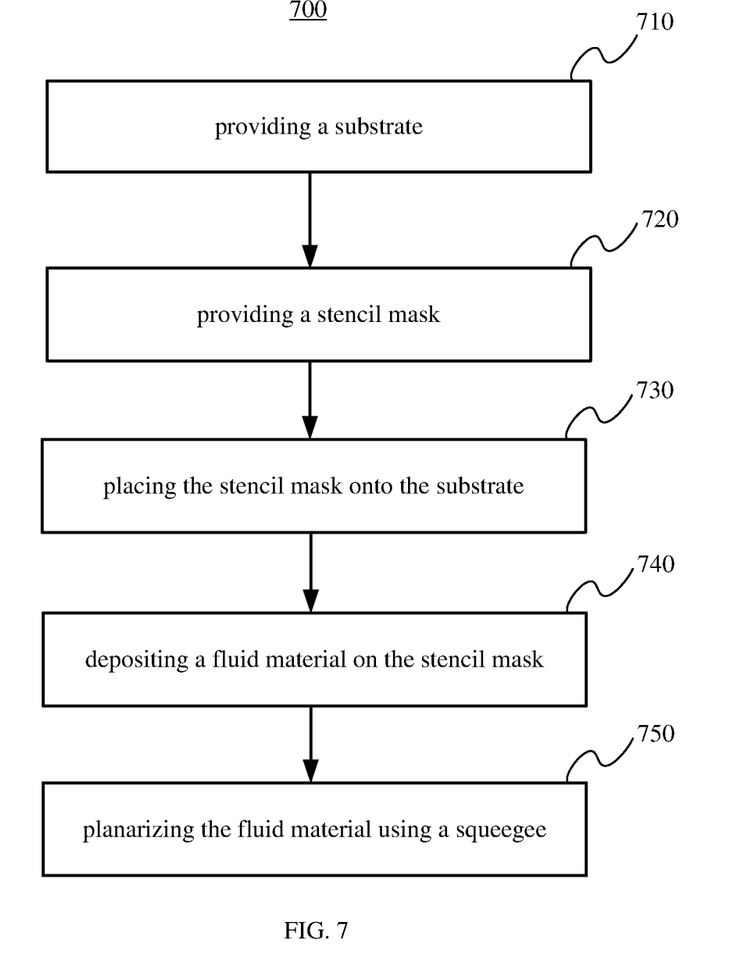
FIG. 7 is a flowchart illustrating a stencil printing method according to an embodiment of the present application.

Referring to FIG. 7, a flowchart illustrating a stencil printing method 700 is illustrated according to an embodiment of the present application.

As illustrated in FIG. 7, the method 700 may start with providing a substrate in block 710. In some embodiments, the substrate may include a substrate surface and a cavity having a cavity bottom surface below the substrate surface. Then, a stencil mask is provided in block 720. In some embodiments, the stencil mask may include a non-reinforcement portion and a reinforcement portion having a thickness greater than that of the non-reinforcement portion. The non-reinforcement portion has a mask surface, and the reinforcement portion has an embossed surface and at least one first stencil window. In block 730, the stencil mask is placed onto the substrate, such that the embossed surface of the stencil mask is inserted into the cavity of substrate and is in contact with the cavity bottom surface. Afterwards, a fluid material is deposited on the stencil mask in block 740, such that the fluid material can flow through the at least one first stencil window onto at least one printing region in the cavity bottom surface, respectively. In block 750, the fluid material is planarized using a squeegee.

Referring to FIGS. 8A-8G, cross-sectional views illustrating various blocks of the stencil printing method 700 are illustrated. In the following, the stencil printing method 700 of FIG. 7 will be described with reference to FIGS. 8A-8G in more details.

Figure 8A:
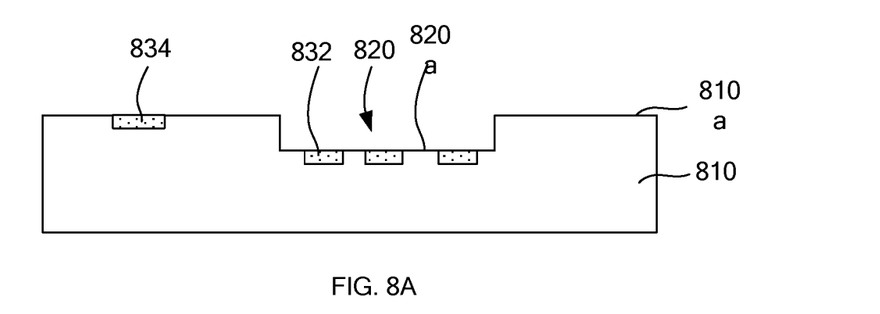
FIGS. 8A to 8G are cross-sectional views illustrating various steps of the stencil printing method illustrated in FIG. 7 according to an embodiment of the present application.

In particular, the process starts with providing a substrate 810 as shown in FIG. 8A. The substrate 810 has a cavity 820 where a thicker electronic component may be mounted later. The substrate 810 has a substrate surface 810a, and the cavity 820 has a cavity bottom surface 820a below the substrate surface 810a of the substrate 810. The cavity 820 may have an area with approximately the same size as the electronic component later mounted therein. The cavity 820 may be formed by laser, etching, drilling, skiving, scoring or other suitable processes.

The substrate 810 may be a PCB, a laminate interposer, a strip interposer, a leadframe, or another suitable substrate. The substrate 810 may include one or more insulating or passivation layers, one or more conductive vias formed through the insulating layers, and one or more conductive layers formed over or between the insulating layers. The substrate 810 may include one or more laminated layers of polytetrafluoroethylene pre-impregnated, FR-4, FR-1, CEM-1, or CEM-3 with a combination of phenolic cotton paper, epoxy, resin, woven glass, matte glass, polyester, or other reinforcement fibers or fabrics. The substrate 810 may also be a multi-layer flexible laminate, ceramic, copper clad laminate, glass, or semiconductor wafer including an active surface containing one or more transistors, diodes, and other circuit elements to implement analog circuits or digital circuits. The substrate 810 may include one or more electrically conductive layers or redistribution layers (RDL) formed using sputtering, electrolytic plating, electroless plating, or other suitable deposition process. The conductive layers may be one or more layers of Al, Cu, Sn, Ni, Au, Ag, Ti, W, or other suitable electrically conductive material. In some embodiments, one or more conductive patterns may be exposed for the surface of the substrate 810, and subsequently connected with one or more external electronic components. For example, as shown in FIG. 8A, at least one first contact pad 832 is exposed from the cavity bottom surface 820a, and at least one second contact pad 834 is exposed from the substrate surface 810a of the substrate 810. The at least one first contact pad 832 and the at least one second contact pad 834 may work as the printing regions in the stencil printing process.

In a specific example, the substrate 810 may be a PCB having a laminated sandwich structure of conductive and insulating layers. The substrate 810 may further include a solder mask or solder resist (SR) layer. The solder resist layer is generally formed on the top surface of the PCB to ensure that solder is only deposited where required and to protect the PCB surface. The cavity 820, the at least one first contact pad 832 and the at least one second contact pad 834 may be formed in the solder resist layer.

Figure 8B:
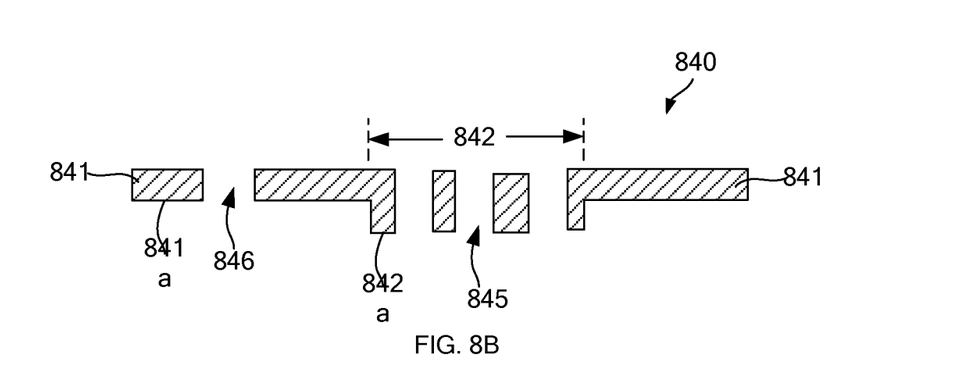

In FIG. 8B, a stencil mask 840 is provided. The stencil mask 840 may be made of stainless steel, nickel, brass or other suitable material. As shown in FIG. 8B, the stencil mask 840 includes a non-reinforcement portion 841 and a reinforcement portion 842. The non-reinforcement portion 841 has a mask surface 841a, and the reinforcement portion 842 has an embossed surface 842a for insertion into the cavity 820 of the substrate 810 shown in FIG. 8A. A thickness of the reinforcement portion 842 is greater than that of the non-reinforcement portion 841. For example, the thickness of the reinforcement portion 842 is greater than that of the non-reinforcement portion 841 by a depth of the cavity 820 of the substrate 810, such that when the stencil mask 840 is placed onto the substrate 810 for stencil printing, the embossed surface 842a may contact the cavity bottom surface 820a of the substrate 810. The reinforcement portion 842 may include at least one first stencil window 845, and the non-reinforcement portion 841 may include at least one second stencil window 846.

In some embodiments, the stencil mask 840 may be similar as the stencil mask 200 shown in FIGS. 2A and 2B. More details about the stencil mask 840 may refer to FIGS. 2A and 2B and corresponding descriptions, and will not be elaborated herein.

Figure 8C:
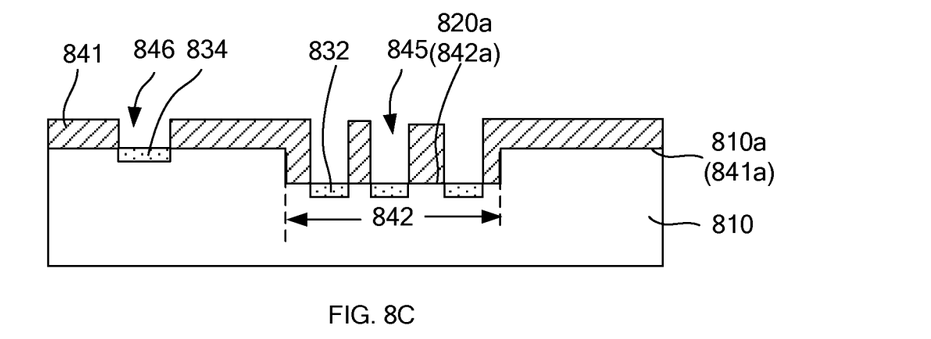

Afterwards, as shown in FIG. 8C, the stencil mask 840 is placed onto the substrate 810. As the first stencil windows 845 in the reinforcement portion 842 and the second stencil windows 846 in the non-reinforcement portion 841 are designed according to positions or shapes of the first contact pad s832 and the second contact pads 834, respectively; the first stencil windows 845 can be aligned with the first contact pads 832 in the cavity 820, and the second stencil windows 846 can be aligned with the second contact pads 834 on the substrate surface 810a of the substrate 810, respectively.

Figure 8D:
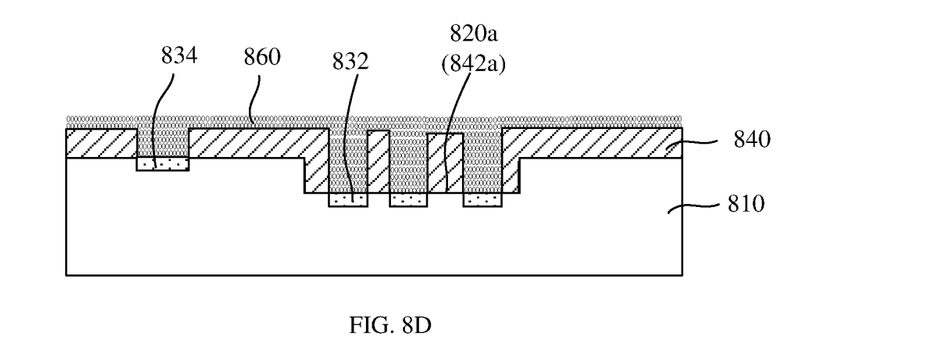

As shown in FIG. 8D, a fluid material 860 is deposited on the stencil mask 840. In some embodiments, the fluid material 860 may be solder paste, glue, ink or the like. The fluid material 860 can flow through the first stencil windows 845 onto the first contact pads 832. In the meantime, the fluid material 860 can also flow through the at second stencil windows 846 onto the second contact pads 834 on the substrate surface 810a of the substrate 810. However, as the embossed surface 842a of the stencil mask 840 is inserted into the cavity 820 and is in contact with the cavity bottom surface 820a, there is no gap between the embossed surface 842a and the cavity bottom surface 820a, so the fluid material 860 cannot flow between the embossed surface 842a and the cavity bottom surface 820a.

Figure 8E:
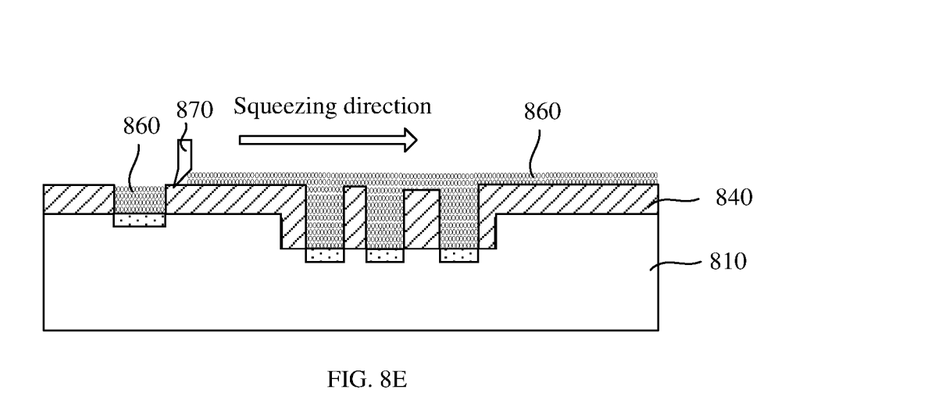

As shown in FIG. 8E, a squeegee 870 is used to planarize the fluid material 860. The squeegee 870 can press on the stencil mask 840 to drive the fluid material 860 flow into the first stencil windows 845 and the second stencil windows 846 if they are not fully filled with the fluid material 860. The flow of the fluid material 860 may depend on the pressure applied by the squeegee 870, the viscosity of the fluid material 860, and the shape and size of the stencil windows 845 and 846. The squeegee 870 can also clean the top surface of the stencil mask 840, and define the thickness of the fluid material 860 filled into the stencil windows 845 and 846.

As the stencil mask 840 can be supported by the reinforcement portion 842 in the cavity 820, the stencil mask 840 will not bend during the planarization process, even if the squeegee 870 applies a significant force to the stencil mask 840. Thus, the heights of fluid material patterns formed in the cavity are the same with each other, which may improve reliability of a semiconductor package to be formed.

Figure 8F:
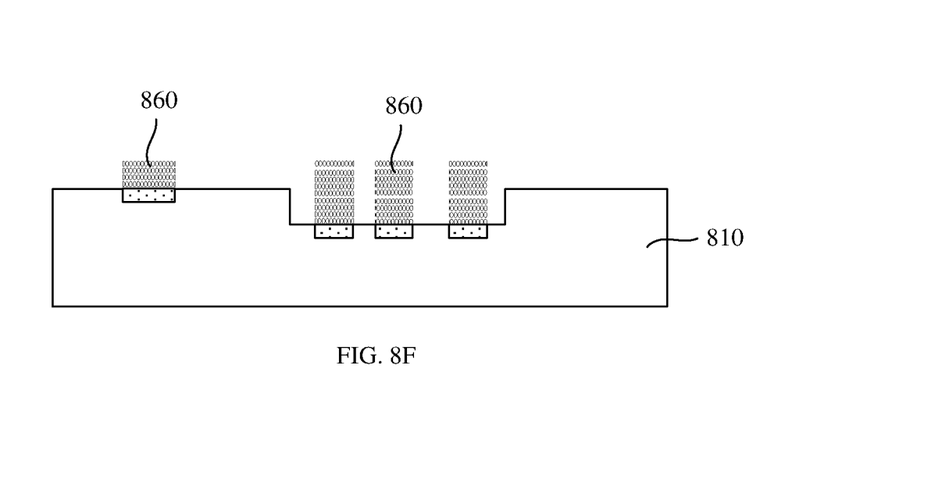

As shown in FIG. 8F, after the fluid material 860 is planarized, the stencil mask 840 is removed from the substrate 810, leaving the patterned fluid material 860 on the substrate 810.

Figure 8G:
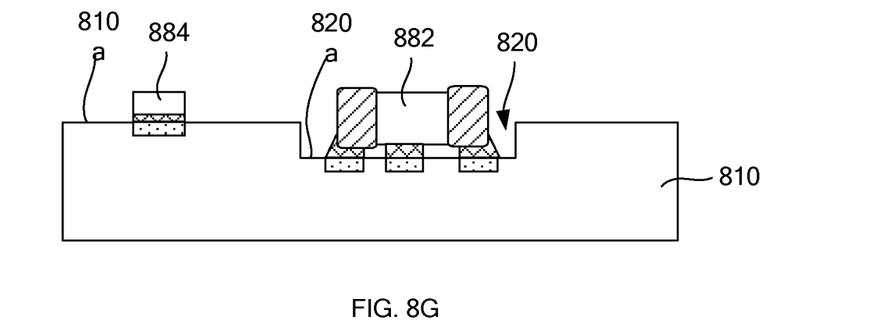

Afterwards, as shown in FIG. 8G, in some embodiments, the fluid material is solder paste, the solder paste in the cavity 820 can be reflowed to mount at least one first electronic component 882 within the cavity 820, and the solder paste on the substrate surface 810a is reflowed to mount at least one second electronic component 884 on the substrate surface 810a of the substrate 810. The first electronic component 882 may have a thickness greater than that of the second electronic component 884. As the first electronic component 882 with the greater thickness is mounted in the cavity, a total thickness of the semiconductor package formed can be reduced.

In some embodiments, the first electronic component 882 or the second electronic component 884 may be passive or active devices as desired to implement any given electrical functionality within the semiconductor package formed. For example, the first electronic component 882 or the second electronic component 884 may be active devices such as semiconductor dice, semiconductor packages, discrete transistors, discrete diodes, etc. The first electronic component 882 or the second electronic component 884 may also be passive devices such as capacitors, inductors, or resistors.

The discussion herein included numerous illustrative figures that showed various portions of a stencil mask and a stencil printing method based on such stencil mask. For illustrative clarity, such figures did not show all aspects of each example assembly. Any of the example assemblies and/or methods provided herein may share any or all characteristics with any or all other assemblies and/or methods provided herein.

Various embodiments have been described herein with reference to the accompanying drawings. It will, however, be evident that various modifications and changes may be made thereto, and additional embodiments may be implemented, without departing from the broader scope of the invention as set forth in the claims that follow. Further, other embodiments will be apparent to those skilled in the art from consideration of the specification and practice of one or more embodiments of the invention disclosed herein. It is intended, therefore, that this application and the examples herein be considered as exemplary only, with a true scope and spirit of the invention being indicated by the following listing of exemplary claims.

The invention claimed is:

1. A stencil mask for printing a fluid material onto a substrate, wherein the substrate comprises a substrate surface, a cavity having a cavity bottom surface below the substrate surface, and at least one printing region within the cavity; and wherein the stencil mask comprises:
    a non-reinforcement portion having a mask surface configured to contact the substrate surface; and
    a reinforcement portion having a thickness greater than that of the non-reinforcement portion, wherein the reinforcement portion comprises:
        an embossed surface for insertion into the cavity of the substrate and configured to contact the cavity bottom surface when the stencil mask is placed onto the substrate for stencil printing; and
        at least one first stencil window that allows the fluid material to flow through the reinforcement portion, wherein the at least one first stencil window is aligned with the at least one printing region within the cavity when the stencil mask is placed onto the substrate for stencil printing.

2. The stencil mask of claim 1, wherein the at least one first stencil window has at its bottom a cross-sectional shape the same as a shape of one of the at least one printing region.

3. The stencil mask of claim 2, wherein the at least one first stencil window has a vertically straight sidewall.

4. The stencil mask of claim 2, wherein the at least one first stencil window has an inward inclined sidewall.

5. The stencil mask of claim 2, wherein a coating layer with anti-stick properties is formed on a sidewall of the at least one first stencil window.

6. The stencil mask of claim 1, wherein the non-reinforcement portion comprises at least one second stencil window that allows the fluid material to flow through the non-reinforcement portion.

7. The stencil mask of claim 1, wherein the thickness of the reinforcement portion is greater than that of the non-reinforcement portion by a depth of the cavity of the substrate.

8. The stencil mask of claim 1, wherein the reinforcement portion comprises a reinforcement base frame, and the non-reinforcement portion is formed by etching a portion of a thickness of the reinforcement base frame at the non-reinforcement portion.

9. The stencil mask of claim 1, wherein the non-reinforcement portion comprises a non-reinforcement base frame, and the reinforcement portion is formed by attaching a reinforcement layer onto a portion of the non-reinforcement base frame.

10. A stencil printing method, comprising:
    providing a substrate, wherein the substrate comprises a substrate surface and a cavity having a cavity bottom surface below the substrate surface;
    providing a stencil mask, wherein the stencil mask comprises a non-reinforcement portion and a reinforcement portion having a thickness greater than that of the non-reinforcement portion, and wherein the non-reinforcement portion has a mask surface, and the reinforcement portion has an embossed surface and at least one first stencil window;
    placing the stencil mask onto the substrate, such that the embossed surface is inserted into the cavity of the substrate and is in contact with the cavity bottom surface;
    depositing a fluid material on the stencil mask so that the fluid material flows through the at least one first stencil window onto at least one printing region in the cavity bottom surface; and
    planarizing the fluid material using a squeegee.

11. The method of claim 10, wherein the non-reinforcement portion comprises at least one second stencil window, and when depositing the fluid material on the stencil mask, the fluid material flows through the at least one second stencil window onto at least one printing region in the substrate surface.

12. The method of claim 10, further comprising:
   removing the stencil mask from the substrate after the fluid material is planarized.

13. The method of claim 10, wherein the substrate comprises a printed circuit board, and the at least one printing region comprises a contact pad formed on the printed circuit board.

14. The method of claim 10, wherein the fluid material comprises solder paste.

15. The method of claim 14, further comprising:
   reflowing the solder paste to mount at least one electronic component within the cavity.

* * * * *